(12) United States Patent
Hecht

(10) Patent No.: US 6,211,738 B1
(45) Date of Patent: Apr. 3, 2001

(54) STABILITY AND ENHANCED GAIN OF AMPLIFIERS USING INDUCTIVE COUPLING

(75) Inventor: James Burr Hecht, Cedar Rapids, IA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/016,195

(22) Filed: Jan. 30, 1998

(51) Int. Cl.⁷ ............................................. H03F 1/14
(52) U.S. Cl. ........................ 330/292; 330/294; 330/302
(58) Field of Search ................................... 330/290, 292, 330/294, 302; 257/551; 333/177

(56) References Cited

U.S. PATENT DOCUMENTS

| | | | |
|---|---|---|---|
| 3,714,462 | 1/1973 | Blackmer | 307/229 |
| 3,801,933 | 4/1974 | Teare | 330/35 |
| 3,919,656 | 11/1975 | Sokal et al. | 330/51 |
| 4,443,773 | 4/1984 | Rall et al. | 333/104 |
| 4,588,959 | 5/1986 | Herzog et al. | 330/149 |
| 4,692,712 | 9/1987 | Quinn | 330/261 |
| 5,548,248 | * 8/1996 | Wang | 330/288 |
| 5,663,570 | * 9/1997 | Reedy et al. | 257/531 |

OTHER PUBLICATIONS

Anderson et al. "An Automatic Tuning and Neutralization Technique for Semiconductor Devices" ISSCC (International Solid–State Circuits Conference) Univ. of Pennsylvania, Feb. 19, 1964. pp 34–35.*

"The Radio Amateur's Handbook" 28th Edition 1951 p. 150.*

* cited by examiner

Primary Examiner—Michael B Shingleton
(74) Attorney, Agent, or Firm—Knobbe, Martens, Olson & Bear, LLP

(57) ABSTRACT

The present invention improves the stability and enhances the gain of amplifiers, particularly transistor amplifiers, by using mutual inductive coupling to partially cancel feedback current. Inductors at the input and output of an amplifier are positioned so that a mutual inductance is created between the two inductors. The mutual inductance is used to cancel the inherent capacitive feedback of transistor amplifiers. The use of mutually coupled inductors allows a large value of effective inductance to be obtained by using relatively small inductors. The use of mutually coupled inductors also avoids the problem of low-frequency instability.

39 Claims, 6 Drawing Sheets

STABILITY AND ENHANCED GAIN OF AMPLIFIERS USING INDUCTIVE COUPLING

FIELD OF THE INVENTION

The invention relates to minimizing feedback in transistor amplifiers. More specifically, the invention uses inductive coupling to cancel a portion of the feedback inherent in these amplifiers.

BACKGROUND

Amplifiers are subject to reduced gain when feedback between the input and output signals occurs. Conventional transistor amplifiers are especially subject to instability from feedback. Such feedback is inherent in transistors due to the presence of parasitic and junction capacitance between the collector-base or the drain-gate terminals.

For example, in a cordless telephone system, a handset generates, amplifies and then transmits the signals to a base station. Any instability or decrease in gain of the amplifier, however, may decrease the quality of the transmitted signal, and as a result, can decrease the performance of the telephone system.

The inclusion of an inductive element between the output and the input terminals can reduce the amount of amplifier feedback at specific frequencies. The presence of the inductive element creates a parallel resonant circuit with the feedback capacitance which presents a high impedance feedback path at the resonant frequency. This technique is known as neutralization. A neutralized amplifier will demonstrate improved stability and increased gain because of the reduction of capacitive feedback.

The technique of neutralization in discrete circuits is not widespread as the feedback is typically minimized at a single frequency. Also, the presence of an inductive element can increase the feedback at lower frequencies and result in instability.

SUMMARY OF THE INVENTION

The present invention provides a unique apparatus and method which improves stability and enhances gain of an amplifier by using mutual inductance to resonate with the feedback capacitance. For example, in cordless or cellular telephone systems, an amplifier amplifies signals prior to transmission to a base station. These amplifiers, however, are subject to reduced performance due to capacitive feedback. The present invention minimizes the capacitive feedback through the use of mutually coupled inductors. Previously, neutralization was accomplished with a single physical inductor. Using mutual inductance to resonate with the feedback capacitance allows the physical inductor element to be eliminated.

Many amplifiers have a first inductor at the input and a second inductor at the output of the amplifier. These inductors act as tuning elements and may provide a direct current path for biasing the amplifier. In common design, it is desired to position these inductors away from each other so the inductors do not inadvertently interact. With discrete designs, shielding is often used to prevent interaction. One embodiment of the invention positions these inductors near each other so to create a mutual inductance between the two inductors. This mutual inductance couples the output terminal to the input terminal of the amplifier. The mutual inductance resonates with the feedback capacitance and thus minimizes the feedback of the amplifier at the resonant frequency.

The use of coupled inductors to neutralize the amplifier also reduces the problem of low-frequency instability. Coupling between inductors decreases at low frequencies. If a mutual inductance is used in the feedback path, this feedback will decrease as the frequency is reduced. Stability of the amplifier is a concern at lower frequencies because the transistor exhibits more gain at lower frequencies. Therefore, the use of a mutual inductance tends to reduce the feedback in the range of frequencies where the gain is greatest, and thus the operation of the amplifier is more stable. By contrast, a discrete inductor between the output and input terminals of the amplifier results in more feedback at lower frequencies, and the operation of the amplifier in this region is less stable.

Another advantage of using coupled inductors is that large values of effective inductance may be realized by choosing an appropriately small value of mutual inductance. In many cases, the value of the inductive element needed to neutralize the amplifier is relatively large. The large value required often makes the use of a discrete inductor unfeasible. This is especially true in integrated circuit amplifiers where the size of each component is critical.

Another advantage of the invention is the ability to use relatively small inductors. Using a small amount of mutual inductance causes a large value of inductance to be sensed across the feedback path. Because the physical proximity of the coupled inductors can control the amount of mutual inductance, inductors with small values can maintain a large value of inductance sensed across the feedback path.

Another advantage is the ability to incorporate the invention within Monolithic Microwave Integrated Circuit (MMIC) amplifiers. MMIC amplifiers are a type of semiconductor amplifier used in the telephone industry. In integrated circuits, printed elements such as spiral inductors are generally tolerant to process and temperature changes. This allows the amount of coupling to be precisely controlled once the layout of the circuit is fixed.

One embodiment of the invention exploits components which may already exist in an amplifier circuit to minimize the capacitive feedback. This allows the amplifier to be neutralized without any increase in cost of manufacturing.

One embodiment of the present invention is a telephone handset for communicating with a base station. The handset generates and amplifies signals to be transmitted to the base station. The handset comprises an amplifier for boosting the gain of the signals prior to transmission, the amplifier having capacitive feedback between an input and an output of the transistor wherein a mutual inductance neutralizes the amplifier. The amplifier comprises a transistor having an input terminal and an output terminal, a first inductor coupled to the input terminal of the transistor, and a second inductor coupled to the output terminal of the transistor. The first inductor and the second inductor are positioned relative to each other to create the mutual inductance between the output terminal of the transistor and the input terminal of the transistor, the mutual inductance resonating with the feedback capacitance in the transistor. The amplifier, the first inductor, and the second inductor are implemented on an integrated circuit without the use of discrete components.

Another embodiment of the present invention is an apparatus comprising an amplifier having an input terminal and an output terminal. A first inductor is coupled to the input terminal of the amplifier and a second inductor is coupled to the output terminal of the amplifier. The first inductor and the second inductor are positioned relative to each other to create a mutual inductance which cancels at least a portion of feedback in the amplifier. The mutual inductance is created between the output terminal of the amplifier and the input terminal of the amplifier. The mutual inductance resonates with the feedback capacitance in the amplifier. The amplifier, the first inductor, and the second inductor may be implemented on a semiconductor material without the use of discrete components.

A further embodiment of the present invention is a method of reducing feedback in an amplifier. The method comprises the acts of coupling a first inductor to an input terminal of the amplifier and coupling a second inductor to an output terminal of the amplifier. The first inductor and the second inductor are then positioned relative to each other to create a mutual inductance which cancels at least a portion of the feedback in the amplifier.

An additional embodiment of the present invention is an apparatus comprising means for amplifying a signal having an input and an output. A first inductive means is coupled to the input of the amplifying means. A second inductive means is coupled to the output of the amplifying means. The first inductive means and the second inductive means are positioned relative to each other to create a mutual inductance between the output of the amplifying means and the input of the amplifying means, the mutual inductance neutralizing the amplifying means.

BRIEF DESCRIPTION OF THE DRAWINGS

These and other aspects, advantages, and novel features of the invention will become apparent upon reading the following detailed description and upon reference to the accompanying drawings.

FIG. 4b is a schematic diagram of an electrically equivalent circuit of the circuit in FIG. 4a.

DETAILED DESCRIPTION

Figure 1:
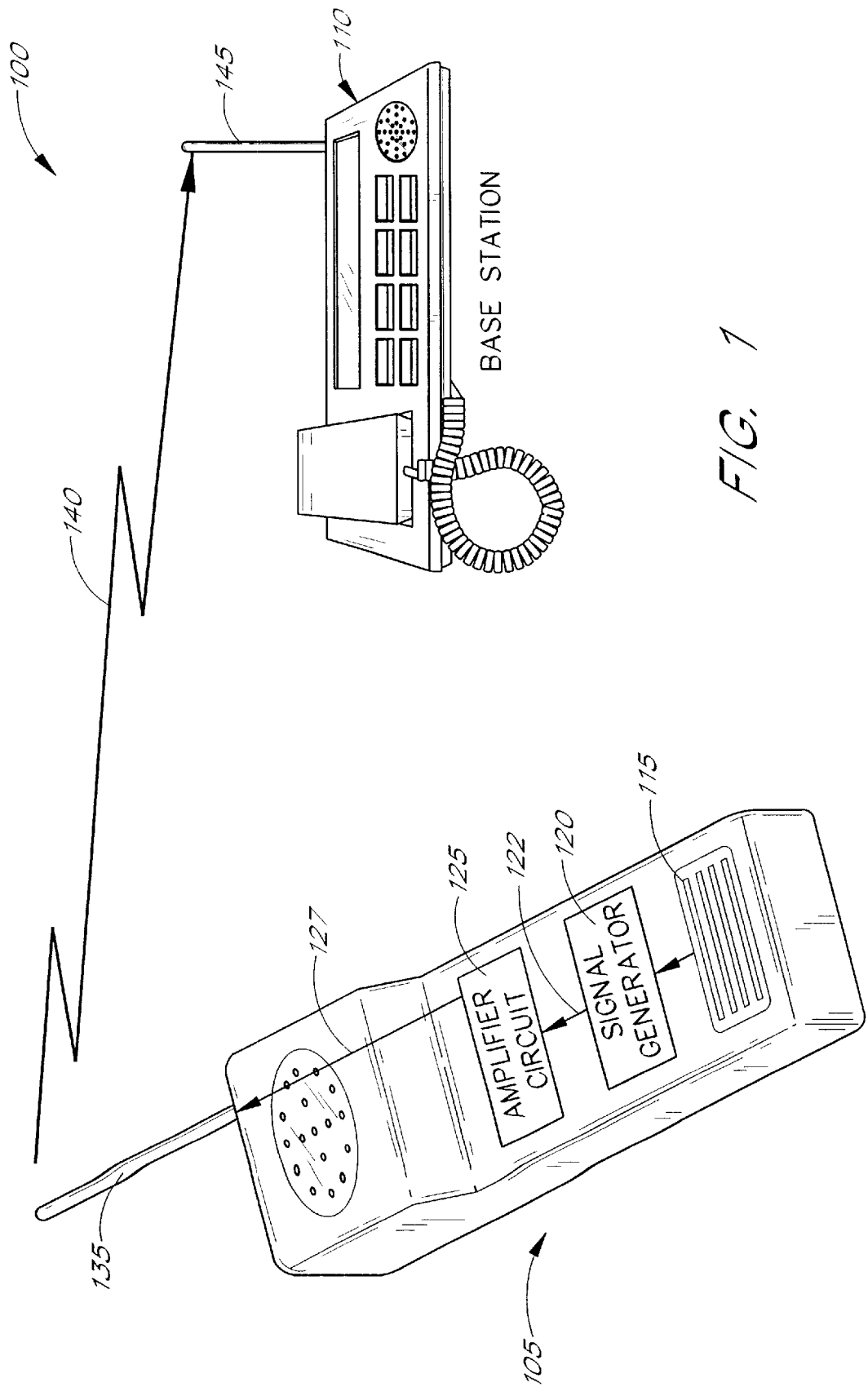
FIG. 1 is a block diagram of a cordless telephone system appropriate for use with the present invention.

A telephone system 100 appropriate for use with one embodiment of the invention is illustrated in FIG. 1. The telephone system 100 includes a handset 105 and a base station 110. A user speaks into a microphone 115 on the handset 105. A signal generator 120 converts the voice detected by the microphone 115 into a signal 122. The signal 122 is input into an amplifier circuit 125 to enhance the range of the handset 105. The amplifier circuit 125 outputs an amplified signal 127 which is sent to an antenna 135 for transmission to the base station 110. The amplified signal 127 is transmitted as indicated by line 140, to an antenna 145 located on the base station 110. It can be appreciated that the handset 105 and the base station 110 can be either part of a cordless telephone system, a cellular telephone system, or the like.

Figure 2:
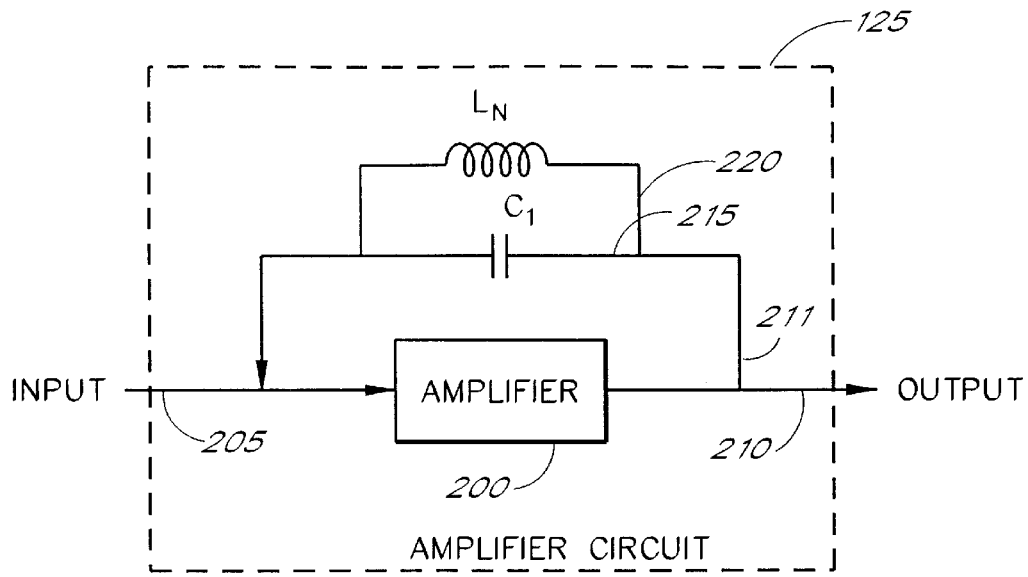
FIG. 2 is a block diagram of an amplifier which uses an inductor to neutralize the amplifier.

One embodiment of the amplifier circuit 125 which may exist in the telephone system 100 is shown in FIG. 2. In this embodiment, an input signal 205 is fed into the input of an amplifier 200 and after amplification, an output signal 210 results. The amplifier 200 may contain a capacitive feedback path 215 connecting the output signal 210 to the input signal 205. The amount of feedback capacitance present is indicated by a capacitor $C_1$ in the capacitive feedback path 215. It should be appreciated that the capacitor $C_1$ is not a physical capacitor but merely the capacitive feedback component of the amplifier 200. By feeding back a portion of the output signal 210 to the input signal 205, not all of the output signal 210 is available for use at the output. This decreases the overall gain of the amplifier 200.

As feedback increases, the stability of the amplifier 200 may decrease. To counter the effects of the capacitive feedback path 215, an inductive path 220 may be added in parallel with the capacitive feedback path 215 to neutralize the amplifier 200. The inductive path 220 contains a physical inductor $L_n$. By placing the physical inductor $L_n$ in parallel with the capacitive feedback path 215, feedback can be minimized at the resonant frequency.

The use of a physical inductor $L_n$ decreases the total feedback along the feedback path 211 at the resonant frequency of the inductor-capacitor combination which comprises the inductor $L_n$ and the inherent feedback capacitance $C_1$. However, the use of the physical inductor $L_n$ also presents many disadvantages. First, at lower frequencies, the inductor $L_n$ provides a low impedance feedback path 211. This low impedance at lower frequencies increases the amount of feedback and results in stability problems in this region. Further, the actual value of the inductor $L_n$ required to resonate with the capacitive feedback is often quite large. This large value of inductance is usually prohibitive in a integrated circuit environment.

Figure 3:
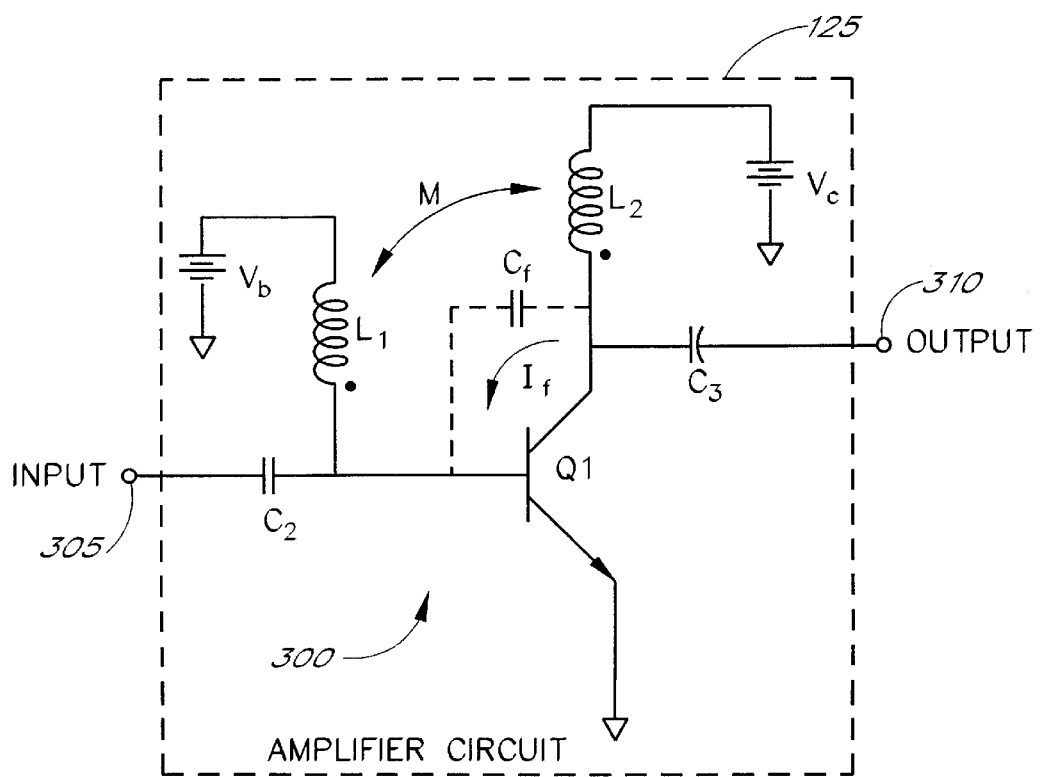
FIG. 3 is a schematic diagram of a transistor amplifier which uses inductive coupling to neutralize the amplifier.

One embodiment of the amplifier circuit 125 comprising a transistor amplifier 300 using inductive coupling to resonate with the feedback capacitor is shown FIG. 3. In this embodiment, the transistor amplifier 300 contains capacitors $C_2$ and $C_3$, a transistor $Q_1$, and inductors $L_1$ and $L_2$. Power sources $V_b$ and $V_c$ are provided for the transistor $Q_1$. The presence of the inherent feedback between the collector and the base is indicated in shadow by a capacitor $C_f$. The feedback current from the output of the transistor $Q_1$ to the input of the transistor $Q_1$ is indicated by a current $I_f$.

In operation, the transistor amplifier 300 receives an input signal 305. The input signal 305 is coupled to a first terminal of the capacitor $C_2$. The second terminal of the capacitor $C_2$ is connected to the first terminal of the inductor $L_1$ and a base of the transistor $Q_1$. The second terminal of the inductor $L_1$ is connected to a first terminal of a power source $V_b$. The second terminal of the power source $V_b$ is connected to ground. The base of the transistor $Q_1$ is also connected to the capacitive feedback path represented by the capacitor $C_f$. The emitter of the transistor $Q_1$ is connected to ground. The collector of the transistor $Q_1$ is connected to a first terminal of the capacitor $C_3$, a first terminal of the inductor $L_2$ and the second terminal of the capacitive feedback path represented by the capacitor $C_f$. The second terminal of capacitor $C_3$ is connected as the output signal 310. The second terminal of the inductor $L_2$ is connected to a first terminal of a power source $V_c$. The second terminal of the power source $V_c$ is connected to ground. The inductors $L_1$ and $L_2$ are physically positioned so as to create a mutual inductance M between the inductors $L_1$ and $L_2$. The mutual inductance M appears across the collector base junction of the transistor $Q_1$.

In a standard transistor amplifier 300, the inductor $L_1$ in combination with the capacitor $C_2$ tune the input of the amplifier 300 and the inductor $L_2$ in combination with the capacitor $C_3$ tune the output of the amplifier 300. The inductor $L_2$ provides a DC path for the power supply $V_c$ to power the transistor $Q_1$. The inductor $L_1$ also provides bias to the base of the transistor $Q_1$. In one embodiment, positioning the inductors $L_1$ and $L_2$ to create a mutual inductance M does not effect each independent inductor's role in either tuning or providing the DC path. The mutual inductance M is in parallel with the capacitive feedback path represented by the capacitor $C_f$. Because the mutual inductance M is in parallel with the capacitive feedback path $C_f$, the amount of feedback at the resonant frequency is minimized.

Figure 4A:
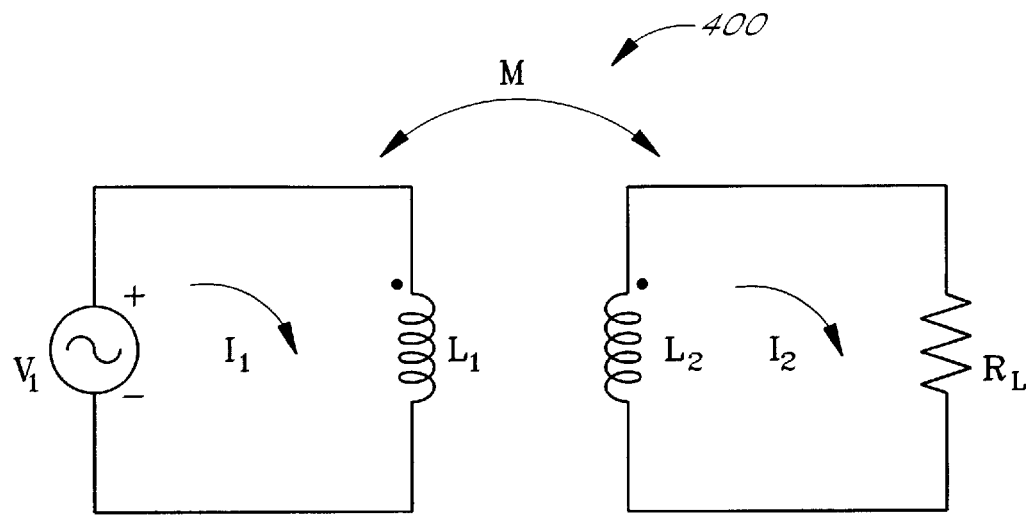
FIG. 4a is a schematic diagram of the mutual inductance of the transistor amplifier of FIG. 3.
Figure 4B:
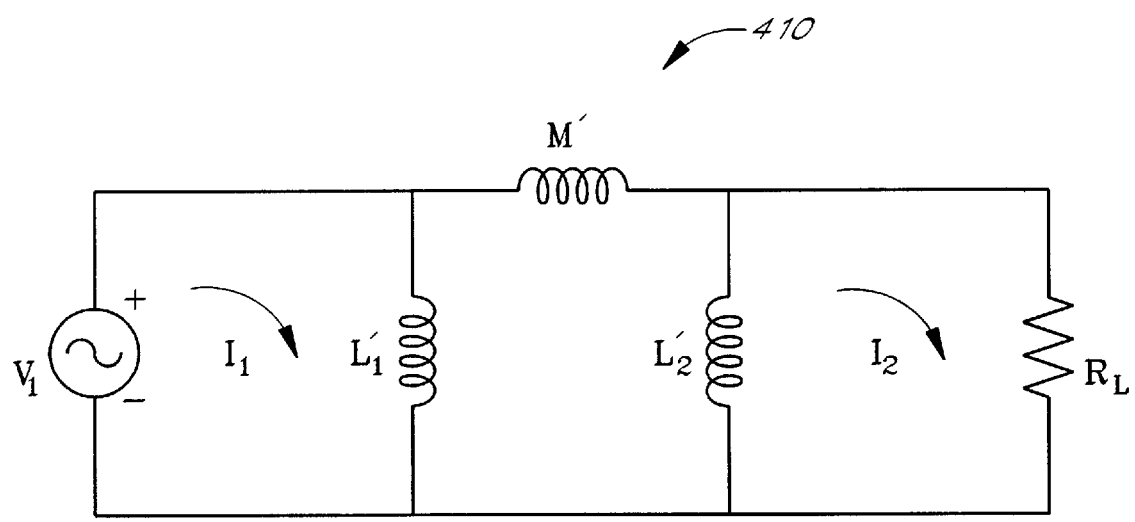

Using a mutual inductance M to neutralize the amplifier feedback also provides additional advantages. First, a large value of inductance to neutralize the amplifier can be obtained by choosing an appropriately small value of the mutual inductance M. This feature is illustrated in FIGS. 4a and 4b. FIG. 4a illustrates an inductive coupled circuit 400 utilizing the two inductors $L_1$ and $L_2$ coupled by a mutual inductance of M. In the inductive coupled circuit 400, a signal $V_1$ creates a current represented by $I_1$. As the current $I_1$ flows through the inductor $L_1$, the mutual coupling between inductors $L_1$ and $L_2$ creates a current $I_2$ which flows through the indicated load resistor $R_L$ in the inductive coupled circuit 400.

The inductive coupled circuit 400 can be redrawn conceptually as a pi network circuit 410 as indicated in FIG. 4b. In FIG. 4b, the inductors $L_1$ and $L_2$ along with the mutual inductance M can be represented by three separate inductors. The values of these three inductors are dependent upon the value of the inductors $L_1$ and $L_2$ and the value of the mutual inductance M coupling the inductors $L_1$ and $L_2$.

In the pi network circuit 410 of FIG. 4b, the signal $V_1$ is connected to a first terminal of a first inductor $L'_1$ and a first terminal of a second inductor M'. The second terminal of the inductor M' is connected to a first terminal of the inductor $L'_2$ and a first terminal of the load resistance $R_L$. The second terminal of the source signal $V_1$ is connected to the second terminal of the inductor $L'_1$, the second terminal of the inductor $L'_2$, and the second terminal of the load resistance $R_L$. The values of the inductors $L'_1$, $L'_2$ and M' vary dependent upon the values chosen for the inductors $L_1$, $L_2$, and the mutual inductance M in FIG. 4a. The value of $L'_1$ is found by the following formula:

$$L'_1 = \frac{L_1 L_2 - M^2}{L_2 - M}$$

The value of $L'_2$ is as follows:

$$L'_2 = \frac{L_1 L_2 - M^2}{L_1 - M}$$

The value of M' is as follows:

$$M' = \frac{L_1 L_2 - M^2}{M}$$

As the equations above indicate, if a small value of mutual inductance M is chosen relative to the values of the inductors $L_1$ and $L_2$, then a large value of inductance M' will be present in the feedback path of a transistor amplifier. For example, values of the inductors $L_1$ and $L_2$ equalling 10 and the value of the mutual inductance M of 1 creates values of $L'_1$=11, $L'_2$=11 and M'=99. Thus, the relative inductance M' presented by the mutual inductance M to the capacitive feedback path will be approximately 10 times greater than the values of the physical inductors $L_1$ and $L_2$. Of course, the values presented above are merely illustrative of the relationship between the value of the inductors $L_1$, $L_2$ and the mutual inductance M between them and the amount of inductance present in parallel with the capacitive feedback path. This relationship allows the use of relatively small physical inductors on the integrated circuit to achieve the result of resonating with a very small feedback capacitance in a transistor amplifier.

One embodiment of the present invention may be implemented in a single chip integrated circuit. In one embodiment, a heterojunction bipolar transistor (HBT) is used for the amplifying MMIC transistor. The HBT transistor is formed on a gallium arsenide substrate. Of course, other types of transistors such as metal-semiconductor field-effect transistors (MESFET) or other types of semiconductor material such as silicon may be used. Other possible types of transistors which could be used include metal-oxide-semiconductor field-effect transistors (MOSFET), complementary metal-oxide-semiconductor transistors (CMOS) and other transistors known to those skilled in the art.

In one embodiment, spiral inductors $L_1$ and $L_2$ are used. As is known to one of skill in the art, spiral inductors $L_1$ and $L_2$ are printed directly on the integrated circuit substrate. By printing the spiral inductors $L_1$ and $L_2$ directly on the integrated circuit, the physical location is permanently fixed and therefore determines the value of the mutual inductance M. Determination of the proper placement of the spiral inductors $L_1$ and $L_2$ to create the desired mutual inductance M may be achieved by testing or computer simulation. Although spiral inductors may be used, the inductors $L_1$ and $L_2$ are not limited to spiral inductors and can be of any type compatible for use with an integrated circuit.

In one embodiment of the present invention, the amplifier circuit 125 exists in a cordless telephone system with a desired frequency of operation at 1.9 gigahertz (GHz). The amplifier circuit is part of a MMIC amplifier using an HBT formed on a gallium arsenide substrate. The HBT device used has a collector-base feedback capacitance (junction and parasitic) of approximately 0.4 picofarad (pF). The equivalent inductance needed to resonate with this capacitance is 17.5 nanohenry (nH).

A printed spiral inductor of 17.5 nH, however, would generally require a large amount of die space on the integrated circuit, and would be cost prohibitive. However, by using mutual inductance, relatively small value spiral inductors $L_1$ and $L_2$ can generate a relatively large effective inductance which is sensed across the feedback path.

To neutralize the amplifier, the conceptual pi network circuit shown in FIG. 4b would require component values of $L'_1$=4 nH, $L'_2$=8 nH, and M'=17.5 nH. To obtain these component values in the conceptual pi network circuit, the actual circuit in FIG. 4a would require values of $L_1$=3.458 nH, $L_2$=5.831 nH, and M=1.085 nH. These values can be calculated from the formulas given above. Having a mutual inductance of M=1.085 nH provides a sensed inductance of 17.5 nH across the feedback path of the HBT device. Therefore, printing spiral inductors of approximately 3.458 nH and approximately 5.831 nH in proximity to each other to result in a mutual inductance M of approximately 1.085 nH neutralizes the HBT device.

In some MMIC amplifiers, two shunt inductors are currently required at the base and the collector of the device for matching and bias purposes. These inductors may be repositioned to create the mutual inductance M. This allows the present invention to be implemented on an integrated circuit without adding any elements to the circuit.

Implementing the transistor amplifier in a single chip integrated circuit is especially advantageous in the wireless telephone field. Generally, wireless telephone systems operate at frequencies of about 800 megahertz (MHz) and above. Preferably, the system operates in a frequency range from about 800 MHz to about 2.5 GHz. In some environments, the frequency range can be from about 900 MHz to about 2 GHz, and more precisely from about 1.3 MHz to 1.9 GHz. For example, in the Personal Handy Phone System (PHS) used in Japan, the wireless frequency operates at about 1.9 GHz. These high frequency ranges require inductor values to be relatively small. The use of mutual inductance allows the relatively small physical inductors needed at these high frequencies yet provides a large effective inductance needed to neutralize the amplifier. This is because of the relationship between the value of the inductors and the value of the mutual inductance M discussed above.

Figure 5A:
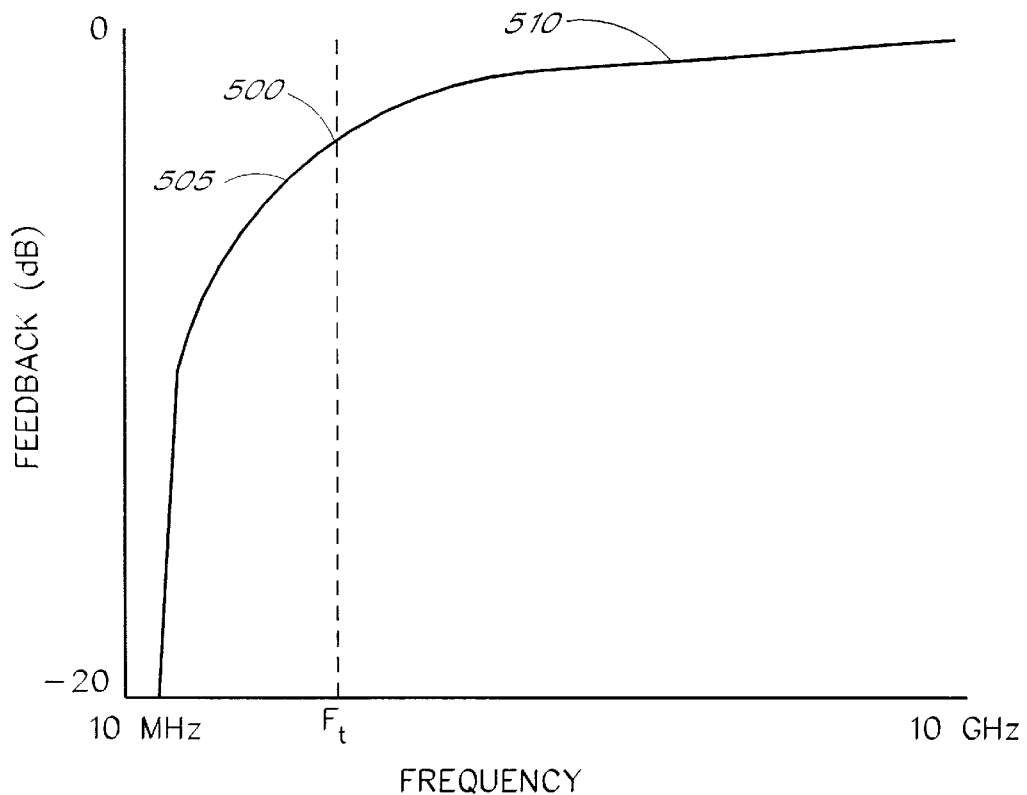
FIG. 5a illustrates the feedback of an amplifier without any neutralization.
Figure 5B:
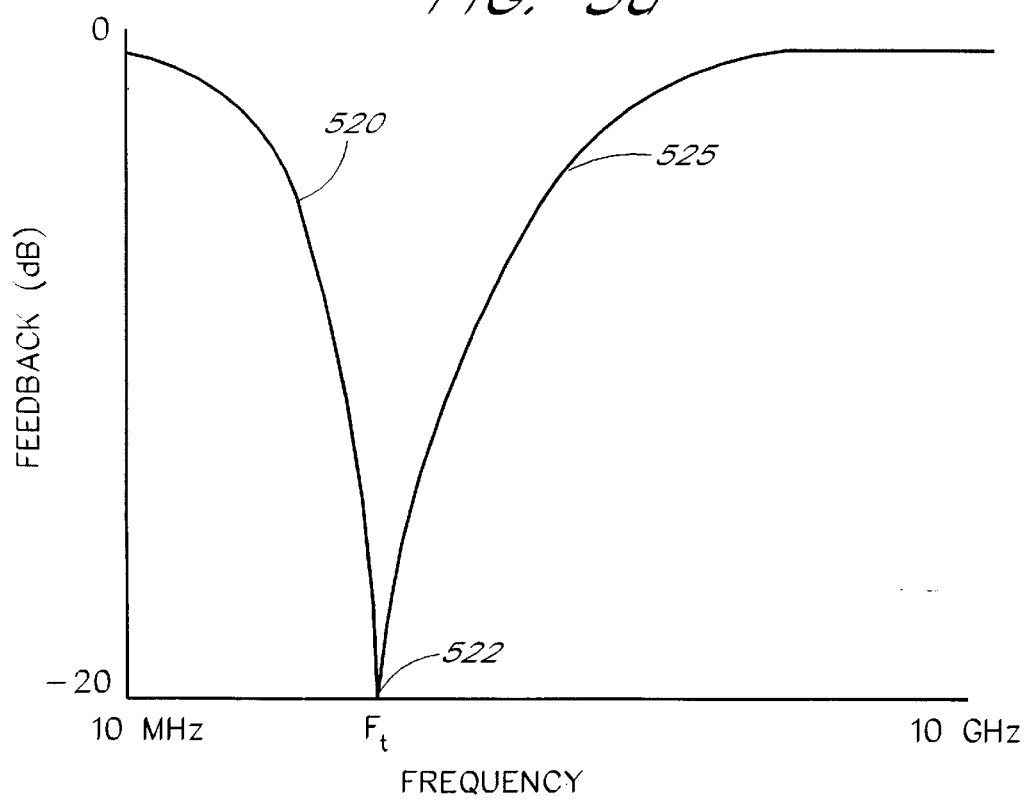
FIG. 5b illustrates the feedback of an amplifier which uses an inductor to resonate with the feedback capacitance.
Figure 5C:
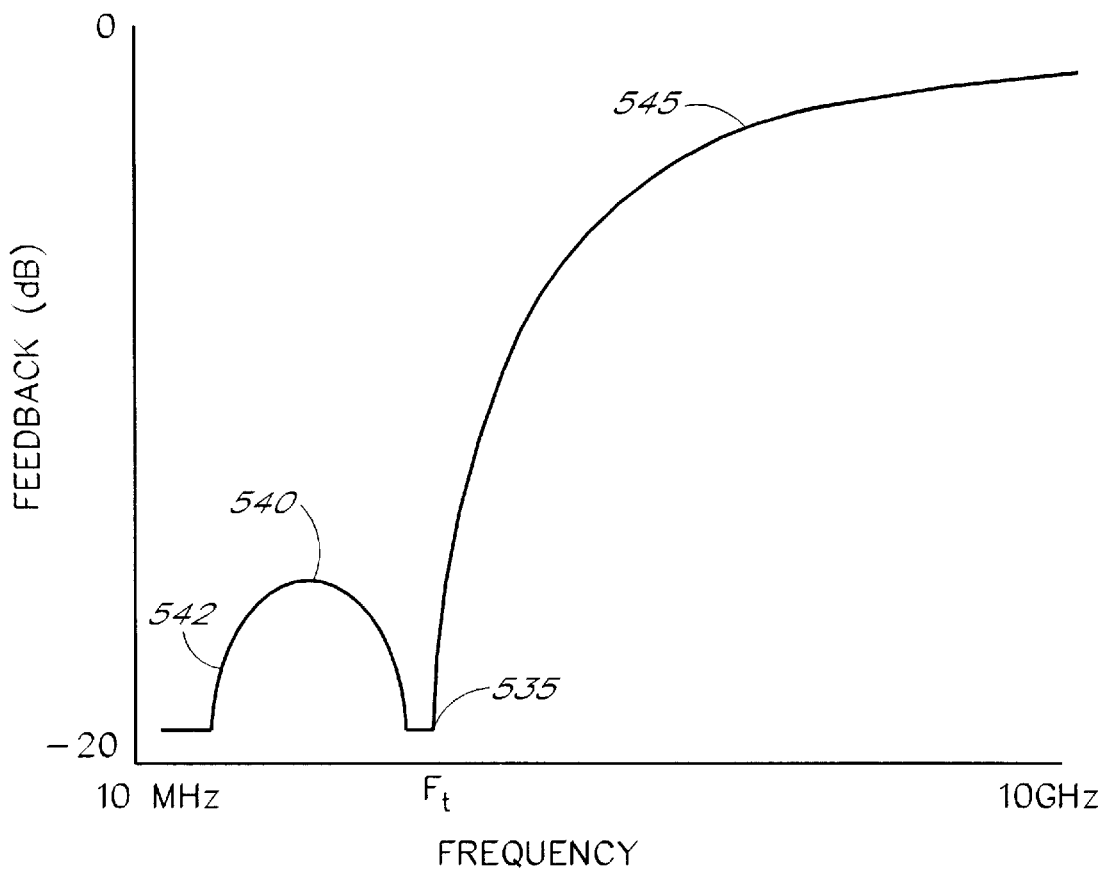
FIG. 5c illustrates the feedback of an amplifier which uses inductive coupling to resonate with the feedback capacitance.

The use of mutually coupled inductance M also provides the advantage of avoiding low frequency instability. FIGS. 5a–5c illustrate the amount of feedback present in relation to the frequency in three different embodiments. In FIGS. 5a–5c, the amount of feedback present in an amplifier circuit is charted in relation to the frequency of operation. In the specific examples shown in FIGS. 5a–5c, the feedback is measured from –20 to 0 dB and the frequency ranges from 10 Mhz to 10 GHz.

FIG. 5a illustrates the amount of feedback without neutralization. As can be seen in FIG. 5a, at relatively low frequencies the feedback is low, but the feedback rapidly increases as the frequency increases. This feedback relationship is shown by the portion of the curve 505. During this portion of operation of the transistor amplifier, the feedback of the amplifier increases and the amplifier could become unstable. A target frequency $F_t$ is a desired frequency of operation. The target frequency $F_t$ may be a single frequency or a range of frequencies. In a cordless or cellular telephone system, the target frequency ranges from about 800 MHz to about 2.5 GHz.

The amount of feedback present at the target frequency $F_t$ is shown on the feedback curve as item 500. As the graph illustrates, the amount of feedback present at the target frequency $F_t$ is high, and could reduce the stability of the transistor amplifier. As the frequency increases from the target frequency $F_t$, the amount of feedback also increases as shown by the portion of the curve 510. The amount of feedback on the portion of the curve 510 may prevent stable operation of the amplifier at a high frequency.

The effect of placing a physical inductor $L_n$ in parallel with the capacitive feedback path is shown in FIG. 5b. A circuit representative of the feedback performance illustrated in FIG. 5b is shown in FIG. 2. In this design, the feedback at the target frequency $F_t$ is minimized as indicated by the dip in the curve 522. However, as the frequency decreases from the target frequency $F_t$, the physical inductor $L_n$ begins to present a low impedance feedback path. This causes the amount of feedback to rapidly increase as the frequency decreases from the target frequency $F_t$ as indicated by a path 520.

As the frequency decreases, the feedback increases to a point where the amplifier may become unstable. Further, as the frequency increases from the target frequency $F_t$, the amount of feedback also increases as indicated by a curve 525. Based upon the gain of the amplifier, the amount of feedback may exceed the point of stability in the amplifier. FIG. 5b illustrates that placing a physical inductor $L_n$ in parallel with the capacitive feedback path works at a specific target frequency $F_t$, but actually may decrease the stability performance of the amplifier at frequencies below the target frequency $F_t$.

The feedback response of the mutually coupled inductive transistor amplifier 300 of FIG. 3 is shown in FIG. 5c. Using the mutually coupled transistor amplifier 300, the feedback is minimized at the target frequency $F_t$ as indicated by the trough 535 of the curve. At the target frequency $F_t$, the reduction of feedback in the transistor amplifier 300 allows the amplifier to operate with maximum gain and maximum stability. The mutually coupled inductance at this single frequency operates as if it is the physical inductor $L_n$. As the frequency is decreased, the amount of feedback slowly increases as indicated by a peak 540. This is similar to the operation shown in FIG. 5b, when the frequency of operation varies from the resonant frequency. However, the amount of feedback at the lower frequencies is still low.

As the frequency continues to decrease, the mutual inductance M also begins to decrease. This causes the amount of feedback to decrease as indicated by a curve 542. This further decrease in feedback allows the transistor amplifier 300 to operate at low frequencies in a stable region. Increasing the frequency above the target frequency $F_t$ increases the amount of feedback as shown by a curve 545. Depending on the gain of the amplifier, the increased frequency may cause the feedback to exceed a point at which the amplifier no longer operates in a stable region.

It can be appreciated from an analysis of FIGS. 5a–5c that the mutually coupled inductors allow a wider range of stable operation of a transistor amplifier than either a single discrete inductor or no neutralization provides.

Figure 6A:
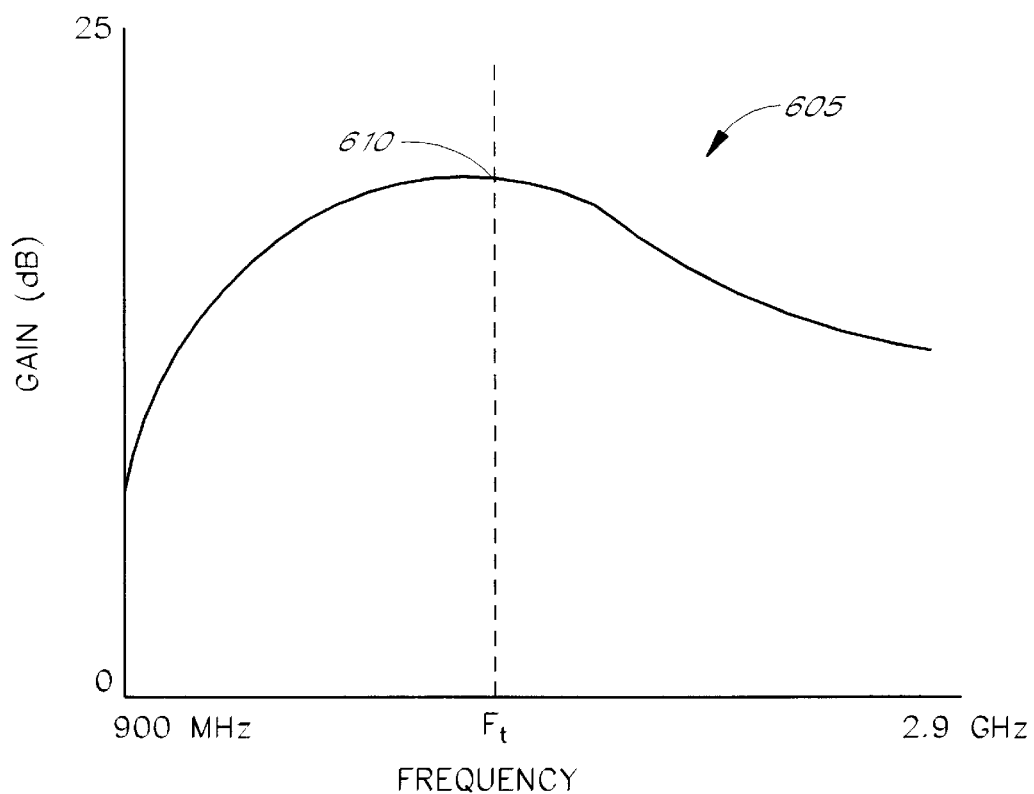
FIG. 6a illustrates the overall gain performance of an amplifier in which neutralization is accomplished with inductive coupling.
Figure 6B:
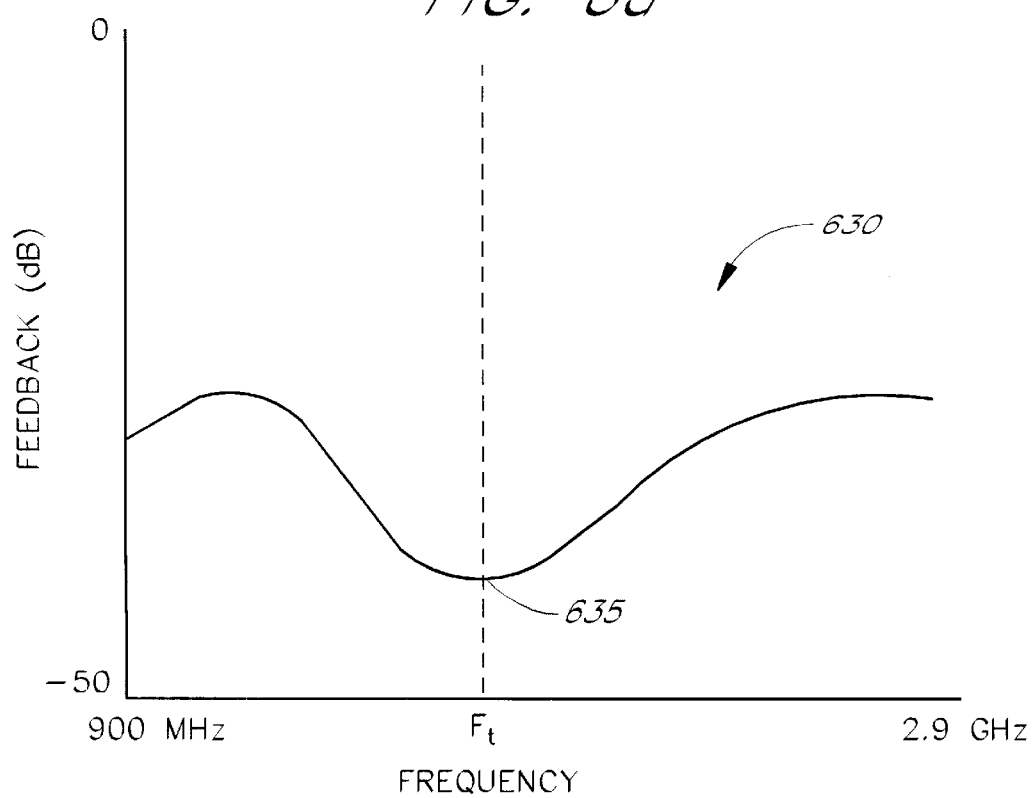
FIG. 6b illustrates the overall feedback of an amplifier in which neutralization is accomplished with inductive coupling.

The relationship between the gain of the amplifier and the total feedback is shown in FIG. 6a and 6b. In FIG. 6a, the gain of a transistor amplifier is measured from 0 to 25 dB and the frequency ranges from 900 MHz to 2.9 GHz. The overall gain performance of a transistor amplifier is illustrated by a curve 605. As the curve 605 indicates, the gain slowly increases as the frequency increases until reaching the target frequency $F_t$ and maximum gain illustrated at a point 610 on the curve 605. As the frequency increases beyond the target frequency $F_t$, the amount of gain slowly decreases.

The overall feedback component of the transistor amplifier is illustrated by a curve 630 of FIG. 6b. In FIGS. 6b, the feedback is measured from –50 to 0 dB and the frequency ranges from 900 Mhz to 2.9 GHz. As the frequency is slowly increased, the overall feedback slowly decreases until the target frequency $F_t$ is reached. At the target frequency $F_t$, the amount of feedback is minimized as indicated by a point 635 on the curve 630. It can be appreciated that at approximately the target frequency $F_t$, the maximum gain at the point 610 on the curve 605 corresponding to the minimum feedback at the point 635 on the curve 630 are present. Increasing the frequency beyond the target frequency slowly increases the amount of feedback as indicated the curve 630 of FIG. 6b.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An amplifier wherein capacitive feedback is neutralized without adding elements, the amplifier comprising:
    a transistor having an input terminal and an output terminal, wherein inherent capacitance exits between the input terminal and the output terminal to generate the capacitive feedback;
    a first inductor coupled to the input terminal of the transistor, wherein value of the first inductor is selected to provide a desired input impedance of the amplifier; and
    a second inductor coupled to the output terminal of the transistor, wherein value of the second inductor is selected to provide a desired output impedance of the amplifier and wherein the first inductor and the second inductor are positioned near each other to create mutual inductance between the output terminal and the input terminal to neutralize the capacitive feedback.

2. The amplifier of claim 1, wherein the amplifier boosts signals in a wireless unit for transmission to a base station.

3. The amplifier of claim 1, wherein the respective values of the first inductor and the second inductor are relatively small to facilitate implementation of the amplifier on an integrated circuit without using discrete components.

4. The amplifier of claim 1, wherein the amplifier remains stable at low frequencies.

5. An apparatus wherein capacitive feedback is neutralized without adding components, the apparatus comprising:
    an amplifier having an input terminal and an output terminal, wherein inherent feedback capacitance between the input terminal and the output terminal generates the capacitive feedback;
    a first inductor coupled to the input terminal of the amplifier, wherein the first inductor is selected to provide a desired input impedance of the amplifier; and
    a second inductor coupled to the output terminal of the amplifier, wherein the second inductor is selected to provide a desired output impedance of the amplifier and wherein the first inductor and the second inductor are positioned relative to each other to create a mutual inductance which cancels at least a portion of the capacitive feedback in the amplifier.

6. The apparatus of claim 5, wherein the mutual inductance is between the output terminal of the amplifier and the input terminal of the amplifier.

7. The apparatus of claim 6, wherein the mutual inductance resonates with the feedback capacitance in the amplifier.

8. The apparatus of claim 5, wherein the value of the mutual inductance is small in relation to the value of the first inductor and the second inductor.

9. The apparatus of claim 5, wherein the amplifier is implemented on an integrated circuit.

10. The apparatus of claim 9, wherein the amplifier is a MMIC amplifier.

11. The apparatus of claim 5, wherein the amplifier, the first inductor, and the second inductor are implemented on a semiconductor material without the use of discrete components.

12. The apparatus of claim 5, wherein the amplifier has local minimum feedback at approximately the frequency which provides maximum gain.

13. The apparatus of claim 5, wherein the amplifier operates in a frequency range of about 800 MHz and above.

14. The apparatus of claim 5, wherein the amplifier remains stable at low frequencies.

15. The apparatus of claim 5, wherein the apparatus amplifies signals for transmission by a telephone handset.

16. The apparatus of claim 15, wherein the telephone handset is part of a remote telephone system.

17. A method of reducing feedback in an amplifier without adding components, the method comprising the acts of:
    coupling a first inductor to an input terminal of the amplifier, wherein the first inductor tunes input of the amplifier;
    coupling a second inductor to an output terminal of the amplifier, wherein the second inductor tunes output of the amplifier; and
    positioning the first inductor and the second inductor relative to each other to create a mutual inductance which cancels at least a portion of the feedback between the input terminal and the output terminal of the amplifier.

18. The method of reducing feedback of claim 17, wherein the amplifier remains stable at low frequencies.

19. The method of reducing feedback of claim 17, wherein the positioning of the first inductor and the second inductor is automated.

20. The method of reducing feedback of claim 17, wherein the amplifier, the first inductor, and the second inductor are implemented on a semiconductor material without the use of discrete components.

21. The method of reducing feedback of claim 17, wherein the mutual inductance resonates with a feedback capacitance in the amplifier.

22. The method of reducing feedback of claim 17, wherein the amplifier operates in a frequency range of about 800 MHz and above.

23. The method of reducing feedback of claim 17, wherein the amplifier operates in a frequency range of about 800 MHz to about 2.5 GHz.

24. The method of reducing feedback of claim 17, wherein the amplifier amplifies signals for transmission by a telephone handset.

25. The method of reducing feedback of claim 24, wherein the telephone handset is part of a remote telephone system.

26. An apparatus to neutralize capacitive feedback without adding components, said apparatus comprising:
    amplifying means having an input and an output;
    first inductive means coupled to the input of the amplifying means, wherein the first inductive means tune the input of the amplifying means; and
    second inductive means coupled to the output of the amplifying means, wherein the second inductive means tune the output of the amplifying means and wherein the first inductive means and the second inductive means are positioned relative to each other to create a mutual inductance between the output of the amplifying means and the input of the amplifying means, the mutual inductance neutralizing the amplifying means.

27. The apparatus of claim 26, wherein the value of the mutual inductance is small in relation to the value of the first inductive means and the second inductive means.

28. The apparatus of claim 26, wherein the amplifying means, the first inductive means, and the second inductive means are implemented on a semiconductor material without the use of discrete components.

29. The apparatus of claim 26, wherein the amplifying means has local minimum feedback at approximately the frequency which provides maximum gain.

30. The apparatus of claim 26, wherein the amplifying means operates in a frequency range of about 800 MHz and above.

31. The apparatus of claim 26, wherein the amplifying means operates in a frequency range of about 800 MHz to about 2.5 GHz.

32. The apparatus of claim 26, wherein the amplifying means amplifies the signal for transmission by a telephone handset.

33. The apparatus of claim 32, wherein the telephone handset is part of a remote telephone system.

34. An amplifier wherein capacitive feedback is neutralized without adding components, the amplifier comprising:
    a transistor having an input terminal and an output terminal, wherein an inherent capacitance exits between the input terminal and the output terminal to generate the capacitive feedback;
    a first inductor coupled to the input terminal of the transistor; and
    a second inductor coupled to the output terminal of the transistor, wherein the first inductor and the second inductor facilitate biasing of the transistor and wherein the first inductor and the second inductor are positioned near each other to create mutual inductance between the output terminal and the input terminal to neutralize the capacitive feedback.

35. The amplifier of claim 34 wherein operation at low frequencies remain stable.

36. The amplifier of claim 34 wherein the amplifier is implemented on an integrated circuit without discrete components.

37. The amplifier of claim 34 where the amplifier boosts signals being transmitted from a wireless unit to a base station.

38. A method of neutralizing feedback in an amplifier without adding components comprising the acts of:
    coupling a first inductor to an input of the amplifier;
    coupling a second inductor to an output of the amplifier, wherein the first inductor in combination with the second inductor bias the amplifier; and
    placing the first inductor near the second inductor to create mutual inductance, wherein the mutual inductance neutralizes feedback between the input and the output of the amplifier.

39. An apparatus to neutralize capacitive feedback without adding components, said apparatus comprising:
    amplifying means having an input and an output;
    first inductive means coupled to the input of the amplifying means; and
    second inductive means coupled to the output of the amplifying means wherein the first and the second inductive means provide biasing for the amplifying means, and wherein the first and the second inductive means are placed close to each other to create a mutual inductance to neutralize capacitive feedback between the input and the output of the amplifying means.

* * * * *